(12) United States Patent
Chilcote et al.

(10) Patent No.: US 7,196,875 B2
(45) Date of Patent: Mar. 27, 2007

(54) PERMALLOY SENSOR HAVING INDIVIDUAL PERMALLOY RESIST PATTERN RUNNERS WITH LENGTHS PERPENDICULAR TO A WAFER LEVEL ANISOTROPY

(75) Inventors: Jason M Chilcote, Frisco, TX (US); Perry A. Holman, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 401 days.

(21) Appl. No.: 10/811,473

(22) Filed: Mar. 24, 2004

(65) Prior Publication Data

US 2005/0213257 A1   Sep. 29, 2005

(51) Int. Cl.
*G11B 5/39* (2006.01)
*G11B 5/33* (2006.01)
(52) U.S. Cl. ...................... 360/313; 324/252
(58) Field of Classification Search ............ 360/313
See application file for complete search history.

(56) References Cited

U.S. PATENT DOCUMENTS

| 4,533,872 | A | | 8/1985 | Boord et al. |
| 4,589,038 | A | * | 5/1986 | Radtke ................ 360/79 |
| 4,739,657 | A | * | 4/1988 | Higashi et al. ........ 73/204.18 |
| 5,351,005 | A | * | 9/1994 | Rouse et al. ............. 324/252 |
| 5,551,283 | A | * | 9/1996 | Manaka et al. ........... 73/31.01 |
| 6,633,462 | B2 | * | 10/2003 | Adelerhof ................. 360/315 |
| 6,717,403 | B2 | * | 4/2004 | Witcraft et al. ........... 324/252 |
| 6,744,248 | B2 | * | 6/2004 | Buchhold et al. ...... 324/207.21 |
| 7,064,937 | B2 | * | 6/2006 | Wan et al. ............... 360/324.1 |
| 7,094,480 | B2 | * | 8/2006 | Nguyen Van Dau et al. ................ 428/811.5 |
| 2004/0165319 | A1 | * | 8/2004 | Wan et al. ............... 360/324.1 |
| 2004/0207035 | A1 | * | 10/2004 | Witcraft et al. ............ 257/427 |
| 2004/0207400 | A1 | * | 10/2004 | Witcraft et al. ............ 324/252 |
| 2004/0254726 | A1 | * | 12/2004 | Witcraft et al. ............ 701/217 |

FOREIGN PATENT DOCUMENTS

| WO | WO 86/00986 | 2/1986 |
| WO | WO 99/61931 | 12/1999 |

* cited by examiner

*Primary Examiner*—Jefferson Evans
(74) *Attorney, Agent, or Firm*—John S. Munday

(57) ABSTRACT

A permalloy sensor having high sensitivity is presented A substrate and a sensor has a first surface having a wafer level anisotropy in a given direction. A permalloy resistor pattern of individual runners is deposited on the surface such that the mechanical length of each of said individual runners is perpendicular to the wafer level anisotropy to cause the sensor to have an anisotropy of about 90°. The permalloy is deposited as a thin film and a silicon wafer is the preferred substrate.

9 Claims, 2 Drawing Sheets

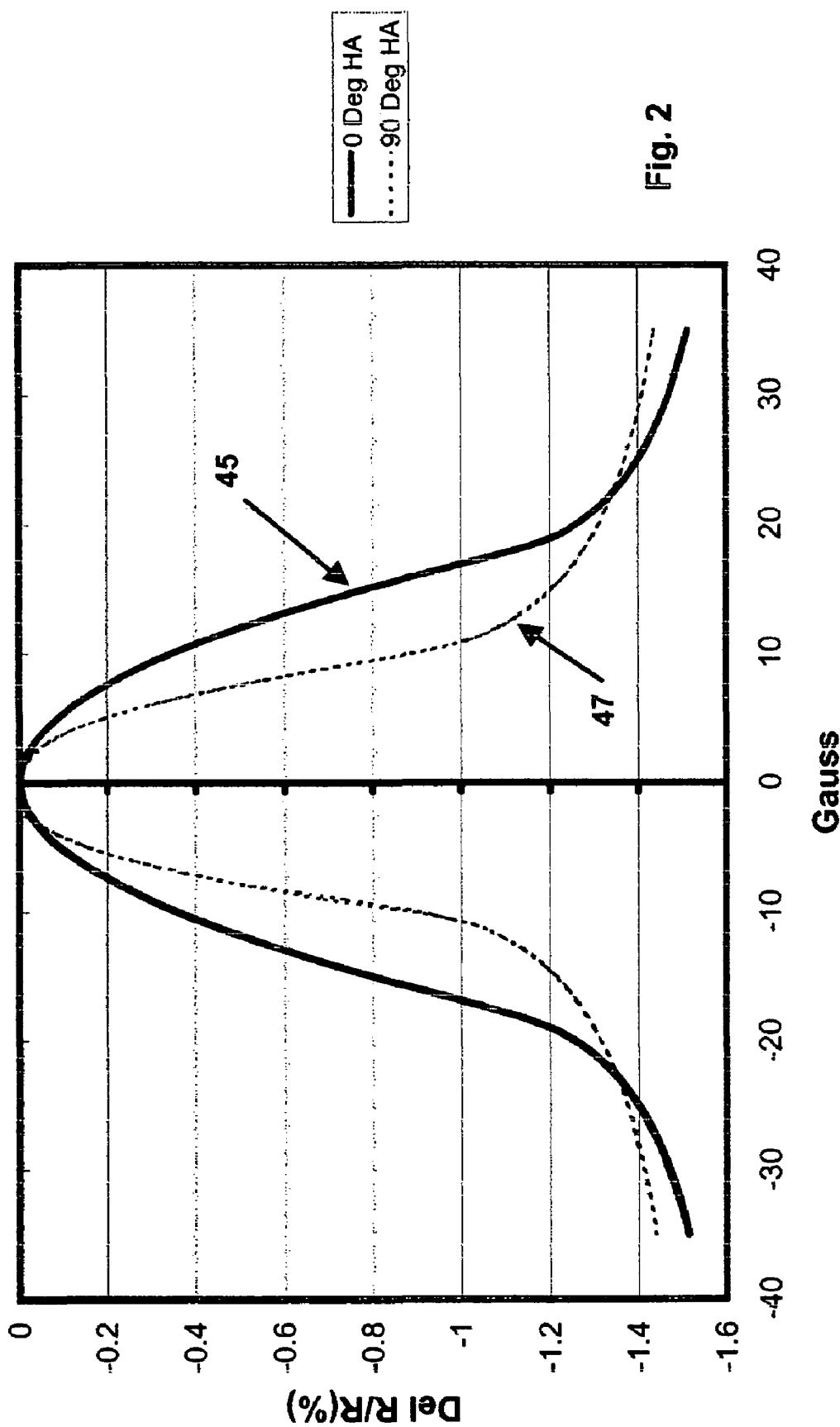

PERMALLOY SENSOR HAVING INDIVIDUAL PERMALLOY RESIST PATTERN RUNNERS WITH LENGTHS PERPENDICULAR TO A WAFER LEVEL ANISOTROPY

FIELD OF THE INVENTION

The present invention relates in general to magnetic films and, more particularly, to permalloy films with increased sensitivity in low field applications.

BACKGROUND OF THE INVENTION

Thin film magnetic devices are of great importance to industry for storage, such as hard disk drive read heads, and magnetic sensors. In low field applications such as ring magnets, for example, functionality is limited by the lowest magnetic field levels that can be sensed.

One specific technology where permalloy has found good use is in magnetoresistive bridge arrays such as shown in U.S. Pat. No. 6,297,628. In that patent, the permalloy runners are formed in a conventional manner as shown in commonly owned U.S. Pat. No. 5,667,879.

The permalloy runners in the above referenced patents are formed such that the "easy" axis is used. In the prior art, permalloy runner lengths are cut in the wafer level anisotropy direction This axis is called the "easy" axis. The easy axis is in line with the wafer level anisotropy and is always in the direction of the length of the resistor. By contrast, the "hard" axis would be in the width direction and perpendicular to the easy axis. However, permalloy runners such as disclosed in the above referenced patents all are parallel to the wafer level anisotropy direction, which is the easy axis. They are, thus, limited in applications by the level of magnetic field that can be sensed.

Accordingly, it would be of great advantage if a permalloy sensor could be developed with increased sensitivity. Another advantage would be to improve such sensitivity without an increase of size or current consumption. Other advantages and features will appear hereinafter.

SUMMARY OF THE INVENTION

The present invention provides an improved permalloy film that can be used as a sensor. The permalloy film of this invention has significantly increased sensitivity at low magnetic field, thus allowing extended sensing range over prior art devices.

In its simplest form the present invention involves a modification of the sensor film by rotating the shape anisotropy with respect to the wafer level anisotropy by 90 degrees so that the wafer level anisotropy is perpendicular to the runner length.

Fabrication of the film of this invention is done using standard silicon semiconductor processing techniques, except that the deposition of permalloy (NiFe at nominally 81% Ni) is perpendicular to the wafer level anisotropy. Sputter-deposited permalloy is delineated using a photolithographic process so that the wafer level anisotropy is perpendicular to the mechanical length of the resistor. Silicon is the preferred substrate and the permalloy is preferably deposited as a thin film.

BRIEF DESCRIPTION OF THE DRAWINGS

For a more complete understanding of the invention, reference is hereby made to the drawings, in which:

FIG. 2 is a graphical comparison between the two different permalloy depositions, showing the improved performance of the present invention.

In the FIGURES, like reference characters designate identical or corresponding components and units throughout the several views.

DETAILED DESCRIPTION OF THE PREFERRED EMBODIMENT

Figure 1:
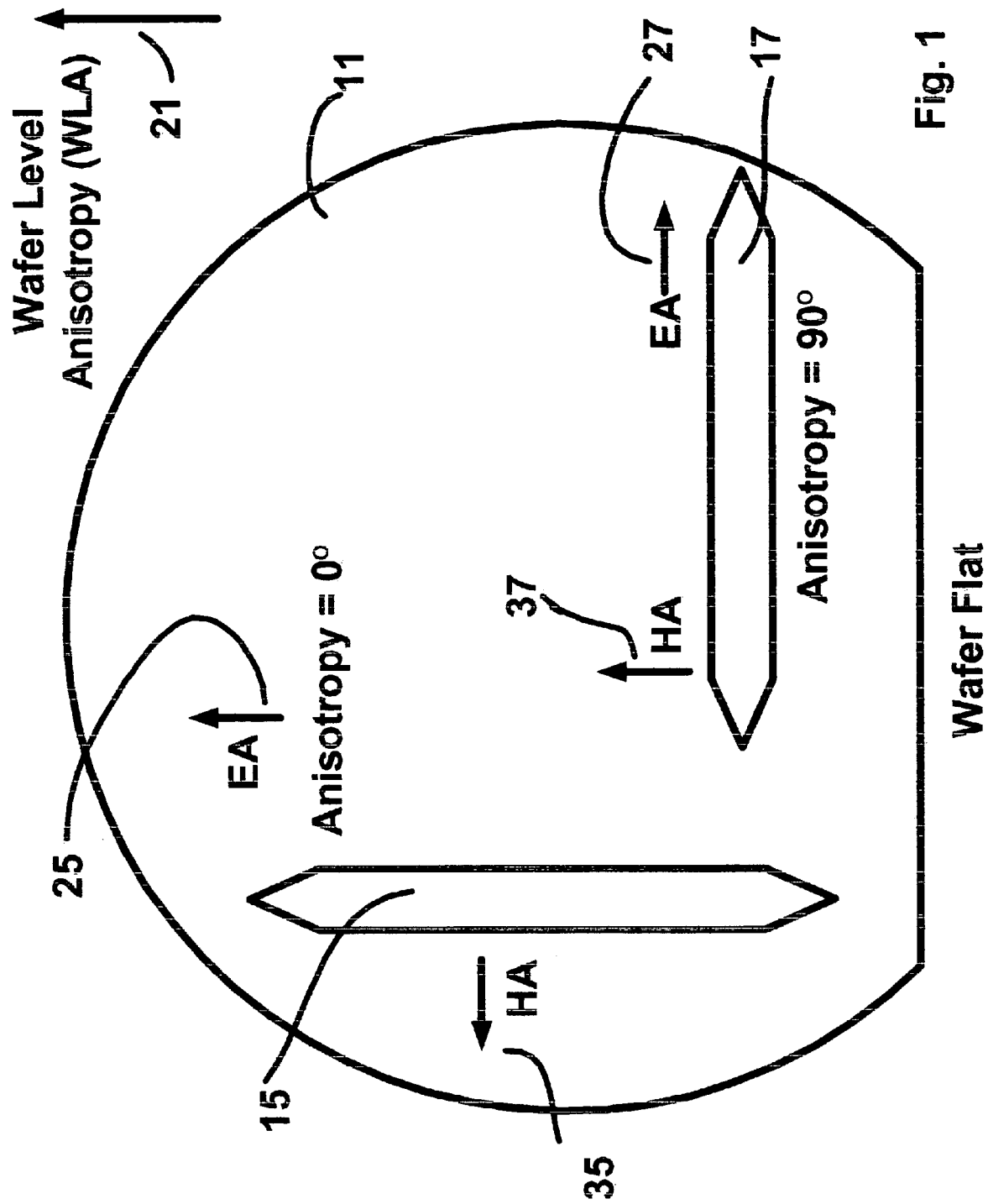
FIG. 1 is a schematic view of a wafer illustrating two different permalloy patterning possibilities.

Referring to FIG. 1, it should be understood that the wafer in practice will have tens of thousands of permalloy deposits thereon, and only two are shown for illustration purposes. As is conventional in sputtering techniques, the magnetic permalloy particles are biased to align the particles as they land on the substrate by the use of permanent magnets. Thus many permalloy resistors will be deposited and aligned in one direction. Also, when the resistors are deposited, all of them will have the same general orientation. FIG. 1 is solely for illustration purposes.

In FIG. 1, a wafer 11 is shown with two different permalloy resistors 15 and 17 deposited thereon. In practice, the length to width ratio of permalloy resistors is large, on the order of 100 or more, and thus both permalloy resistors 15 and 17 are shown schematically since a line 100 times longer than its width would be less clear for illustrative purposes. An easy axis, EA, is always in the direction of the length of the resistor, so that permalloy resistor 15 has an EA shown by arrow 25 and permalloy resistor 17 has an EA shown by arrow 27. Similarly, a hard axis HA is always in the width direction and perpendicular to the direction of the EA. Thus permalloy resistor 15 has a HA shown by arrow 35 and permalloy resistor 17 has a HA shown by arrow 37.

The wafer itself has a wafer level anisotropy, WLA, shown in FIG. 1 by arrow 21. When the EA shown by arrow 25 is parallel to the WLA shown by arrow 21, the anisotropy is seen as 0° of angle with respect to each other. Arrow 25 is parallel to arrow 21. This represents the known configuration of permalloy resistors as used, for example, in the magnetoresistive bridge array shown in U.S. Pat. No. 6,297,628. The sensitivity, particularly at very low Gauss, is acceptable for the purposes of that invention. The sensitivity also limits use of the invention to circumstances without the need for very high sensitivity. This is true for other uses of permalloy resistors.

The present invention provides a substantial improvement in sensitivity of permalloy resistor by depositing the permalloy particles in a direction perpendicular to the WLA This is done by patterning the resistor at 90°0 to the WLA When the EA shown by arrow 27 is perpendicular to arrow 21, the anisotropy is seen as 90° of angle with respect to each other. This represents the present invention, which has been found to have significantly superior sensitivity under the same conditions and circumstances without any increase in size or current consumption.

A test wafer with resistors patterned perpendicular to each other was created, and the resulting performance is shown in FIG. 2.

Specifically, the change in resistance, expressed as delta R/R as a percent was measured as the wafers were exposed to changes in Gauss in the positive and negative ranges from zero. The solid line 45 represents a conventional resistor with anisotropy of 0°. The dotted line 47 represents the present invention wafer with anisotropy of 90°. If the Gauss change is very small such as ±5 Gauss, line 45 shows almost no change in resistance, so that delta R/R is about 0.09%, whereas line 47 shows a change in delta R/R of about 0.17%, an increase of almost a factor of two. Similarly, if the Gauss change is ±10 Gauss, line 45 shows a delta R/R of perhaps just over 0.33% compared to line 47 with a delta R/R of about 0.9%. The present invention is shown here to produce a signal that is two to three times larger than the prior art, thus permitting the invention to be incorporated into designs where much greater sensitivity will be obtained.

The present invention is admirably suited for use in a variety of general magnetic sensors including ring magnets.

While particular embodiments of the present invention have been illustrated and described, they are merely exemplary and a person skilled in the art may make variations and modifications to the embodiments described herein without departing from the spirit and scope of the present invention. All such equivalent variations and modifications are intended to be included within the scope of this invention, and it is not intended to limit the invention, except as defined by the following claims.

The invention claimed is:

1. A permalloy sensor device for sensing low magnetic field levels having high sensitivity, comprising:
   a substrate and a sensor on said substrate, said sensor having a first surface, said first surface having a magnetic wafer level anisotropy in a given direction; and
   a permalloy resistor pattern consisting essentially of individual runners patterned in said first surface such that the mechanical length of each and every one of said individual runners is perpendicular to the magnetic wafer level anisotropy to cause said sensor to have an anisotropy of about 90°.

2. The device of claim 1, wherein said permalloy is deposited as a thin film.

3. The device of claim 2, wherein said substrate is a silicon wafer.

4. A permalloy sensor for sensing low magnetic field levels having high sensitivity, comprising:
   substrate means for forming the body of a sensor and having a first surface, said first surface having a magnetic wafer level anisotropy in a given direction; and
   permalloy resistor pattern means for providing individual runners patterned in said surface consisting essentially of runners such that the mechanical length of each and every one of said individual runners is perpendicular to the magnetic wafer level anisotropy to cause said sensor to have an anisotropy of about 90°.

5. The of claim 4, wherein said permalloy is deposited as a thin film.

6. The of claim 5, wherein said substrate is a silicon wafer.

7. A method of forming a permalloy sensor for sensing low magnetic field levels including the steps of:
   providing a substrate and a sensor on said substrate, said sensor having a first surface, said first surface having a magnetic wafer level anisotropy in a given direction; and
   patterning in a permalloy resistor pattern consisting essentially of individual runners on said surface such that the mechanical length of each and every one of said individual runners is perpendicular to the magnetic wafer level anisotropy to cause said sensor to have an anisotropy of about 90°.

8. The method of claim 7, wherein said permalloy is deposited as a thin film.

9. The method of claim 8, wherein said substrate is a silicon wafer.

* * * * *